United States Patent
Kidambi

(10) Patent No.: US 8,643,517 B2
(45) Date of Patent: Feb. 4, 2014

(54) GRADIENT-BASED APPROACH TO SAMPLE-TIME MISMATCH ERROR CALIBRATION IN A TWO-CHANNEL TIME-INTERLEAVED ANALOG-TO-DIGITAL CONVERTER

(75) Inventor: Sunder S. Kidambi, Austin, TX (US)

(73) Assignee: Intersil Americas LLC, Milpitas, CA (US)

( * ) Notice: Subject to any disclaimer, the term of this patent is extended or adjusted under 35 U.S.C. 154(b) by 6 days.

(21) Appl. No.: 13/455,617

(22) Filed: Apr. 25, 2012

(65) Prior Publication Data

US 2012/0274491 A1 Nov. 1, 2012

Related U.S. Application Data

(60) Provisional application No. 61/480,696, filed on Apr. 29, 2011.

(51) Int. Cl.
*H03M 1/06* (2006.01)

(52) U.S. Cl.
USPC ........... 341/118; 341/155; 341/145; 341/156; 341/128; 375/296; 375/260; 375/375; 375/370

(58) Field of Classification Search
USPC .................. 341/118–155; 375/232, 375, 269
See application file for complete search history.

(56) References Cited

U.S. PATENT DOCUMENTS

| | | | |
|---|---|---|---|
| 6,292,121 B1 | 9/2001 | Cake et al. | |
| 7,336,729 B2* | 2/2008 | Agazzi | 341/118 |
| 7,501,967 B2* | 3/2009 | Draxelmayr et al. | 341/155 |
| 7,551,114 B2 | 6/2009 | Joy et al. | |
| 7,693,214 B2 | 4/2010 | Shida | |
| 7,839,313 B2 | 11/2010 | Kidambi | |
| 7,839,323 B2 | 11/2010 | Kidambi | |
| 8,063,803 B2* | 11/2011 | Kidambi | 341/118 |

FOREIGN PATENT DOCUMENTS

WO WO 2006/083199 A1 8/2006

OTHER PUBLICATIONS

M. Seo, M. J. W. Rodwell and U. Madhow, "A low computation adaptive technique for blind correction of mismatch errors in multichannel time-interleaved ADCs", IEEE international Midwest Symposium on Circuits and Systems, pp. 292-296, Sep. 2006 (Day not available).

M. Seo and M. Rodwell, "Generalized Blind Mismatch Correction for a two-channel Time-interleaved ADC: Analytic Approach", IEEE Transactions on Circuits and Systems, 2007, pp. 109-112, May 27-30, 2007.

J. Elbornsson, F. Gustaffson and J. E. Eklund, "Blind Adaptive Equalization of Mismatch Errors in a time-interleaved A/D Converter System", IEEE Transactions on Circuits and Systems-1:, vol. 51, No. 1, pp. 151-158, Jan. 2004 (Day not available).

(Continued)

*Primary Examiner* — Lam T Mai
(74) *Attorney, Agent, or Firm* — Cesari and McKenna, LLP

(57) ABSTRACT

Correcting phase error in a two-channel TIADC system in a manner that is independent of the Nyquist zone(s) occupied by the input signal. In the preferred approach this is done using the gradient of a phase error estimate. The gradient may be determined from a simplified expression of linear regression; the direction of the adaptation is then controlled by the sign of the gradient. The adaptive algorithm converges to the optimal value regardless of the Nyquist zone occupied by the input signal.

24 Claims, 10 Drawing Sheets

(56) References Cited

OTHER PUBLICATIONS

J. Elbornsson, F. Gustaffson and J. E. Eklund, "Blind Equalization of Time Errors in a Time-Interleaved ADC System", IEEE Transactions on Signal Processing, vol. 53, No. 4, pp. 1413-1424, Apr. 2005 (Day not available).

D. Camarero, Jean-Francois Naviner and P. Loumeau, "Digital background and blind calibration for clock skew error in time-interleaved analog-go-digital converters", SBCCI, Pernambuco, Brazil, pp. 228-232, Sep. 7-11, 2004.

B. P. Ginsburg and A. P. Chandrakasan, "Dual Scalable 500MS/s, 5b Time-Interleaved SAR ADCs for UWB Applications", Department of Electrical Engineering and Computer Science, Massachusetts Institute of Technology, Cambridge, MA 02139, USA (Date not available).

M. Looney, "Advanced Digital Post-Processing Techniques Enhance Performance in Time-Interleaved ADC Systems", (Date not available).

"Multiply Your Sampling Rate with Time-Interleaved Data Converters", Application Note 989, [online] http://www/maxim-ic.com/an989, Mar. 1, 2001.

\* cited by examiner

GRADIENT-BASED APPROACH TO SAMPLE-TIME MISMATCH ERROR CALIBRATION IN A TWO-CHANNEL TIME-INTERLEAVED ANALOG-TO-DIGITAL CONVERTER

CROSS-REFERENCE TO RELATED APPLICATION(S)

This application claims the benefit of U.S. Provisional Application Ser. No. 61/480,696 filed Apr. 29, 2011 entitled "Gradient-Based Approach to Sample-Time Mismatch Error Calibration in a Two-Channel Time Interleaved Analog-to-Digital Converter." The entire contents of the above-referenced application are hereby incorporated by reference.

BACKGROUND

Time-interleaved Analog-to-Digital Converters (TIADC) have received considerable attention in the recent past in applications that require very high sample rates, i.e., sample rates that cannot be achieved by a single present-day ADC. In a TIADC employing M ADCs, each ADC operates at $F_S/M$ where $F_S$ is the sampling rate of the TIADC. The output from each TIADC is combined at $F_S$ using a commutator to produce a sample rate converter operating at $F_S$. Ideally, the slower ADCs should have the same offset, gain, and uniform sample instants. In practice, however, due to component mismatches, this requirement is difficult to achieve. The differences in the offset values of the slower ADCs produce tones at $kF_S/M$, for $k=0, 1, 2, \ldots$, irrespective of the input signal. The differences in the gain values of the ADCs produce spurious (or unwanted) signals at $\pm F_{in}+kF_S/M$, for $k=1, 2, \ldots$, where $F_{in}$ is any frequency of the input signal. Similarly, the non-uniformity of sampling instants of each ADC with respect to the TIADC sampling frequency produce spurious signals at exactly the same location as the spurs due to gain mismatch. However, the spurs due to the sample-time mismatch are orthogonal to those due to the gain mismatch. Consequently, the resulting spurious signals due to offset, gain and sample-time mismatches degrade the performance of the TIADC system significantly, thus making the estimation and correction of these errors imperative to improve performance.

SUMMARY

In a preferred embodiment, phase error is corrected in a two-channel TIADC system in a manner that is independent of the Nyquist zone(s) occupied by an input signal. The input signal is first converted with two Time-Interleaved Analog to Digital Converters (TIADC) cores, to provide to a set of two ADC outputs as first and second digital signals. The outputs of the TIADC cores are interleaved to form a digital converted representation of the input signal. A sample time error (also referred to as a phase error) is then estimated from the first and second digital signals. The phase correction is then carried out using the phase error estimate, irrespective of a Nyquist zone occupied by the input signal. The correction signal is then applied to a sample time correction input of at least one of the TIADC cores.

In one implementation, the correction signal is determined from a sign of the gradient of the sample time error. The sign of the gradient of the sample time error may be further processed by a filter, such as a Finite Impulse Response filter, before applying it to the phase correction input.

The approach lends itself to a mixed signal solution such that the phase error estimate can be determined digitally, but the correction signal still applied as an analog value output as from a Phase Look Up Table (PLUT). In a specific implementation, the correction signal is determined from a Phase Look Up Table (PLUT) where $$PLUT^k = N_i + \lfloor \mu^k \rfloor$$

$$\mu^{k+1} = \mu^k - \text{sign}(e_{phase}^k(\Delta t))\ \text{sign}(m_s^k)\mu_{phase}^k$$

$$\mu_{phase}^{k+1} = \max\left(\frac{\mu_{phase}^k}{2}, \mu_{phasemin}\right) \text{ if } \mod(k, k_p)$$
$$= 0$$

where $N_i$ is an initial address offset of the PLUT, $\mu^k$ denotes a variable at the $k^{th}$ iteration, and $\mu_{phase}^k$ denotes a step size at the $k^{th}$ iteration, $\mu_{phase}^0 = \mu_{phasemax}$, $k_p$ is any arbitrary positive number, and $e_{phase}(\Delta t_k)$ is an estimate of the phase error at iteration k.

Any of several known algorithms to provide the initial estimate of the phase error can be used. One such sample-time error estimator was disclosed in U.S. Pat. No. 7,839,323 entitled "Error Estimation and Correction in a Two-Channel Time Interleaved Analog to Digital Converter", filed Apr. 7, 2009, which is hereby incorporated by reference in its entirety. Other mismatch error correction algorithms may also be used, however.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF A PREFERRED EMBODIMENT

Figure 1:
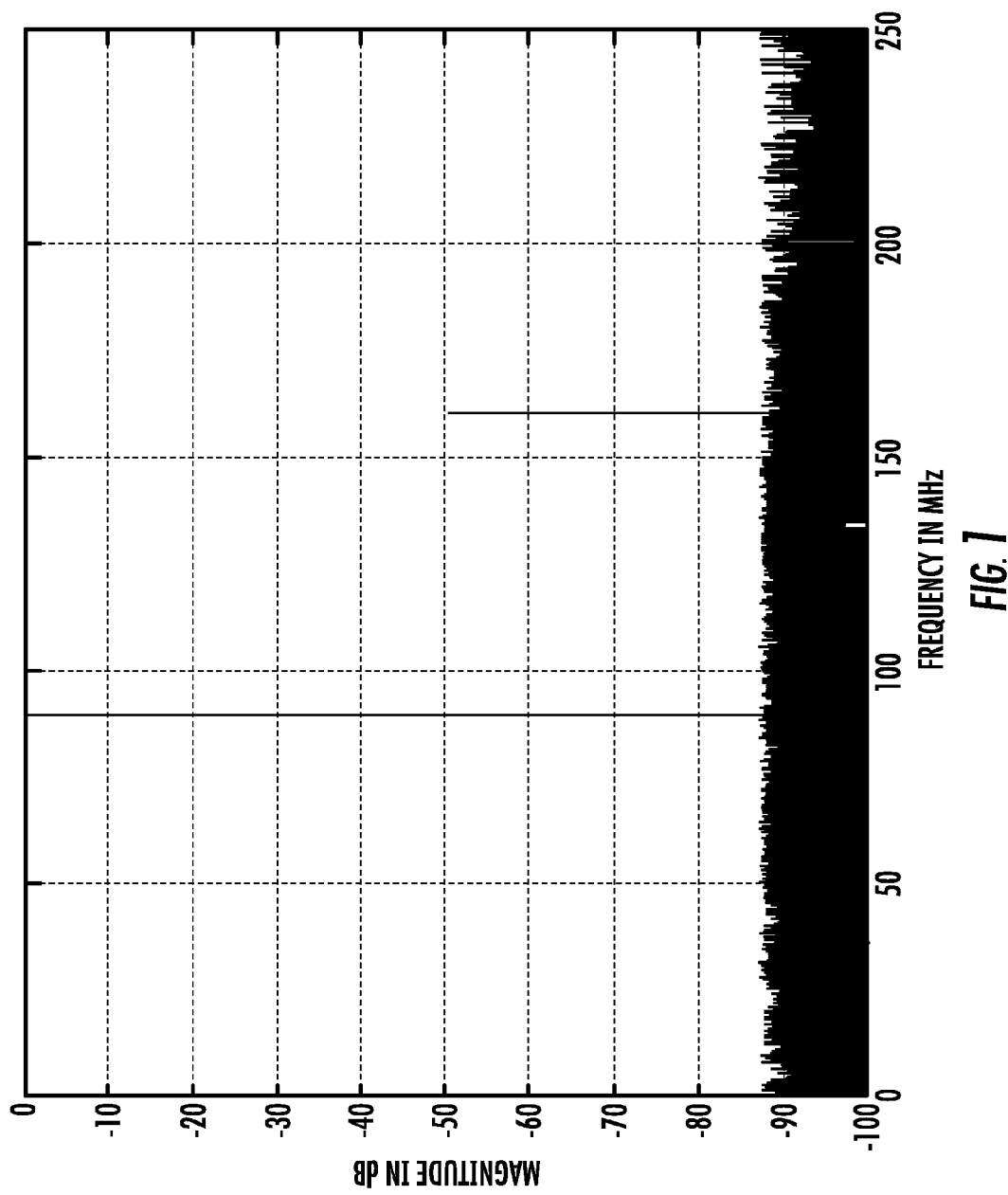
FIG. 1 illustrates a spectrum of an input signal occupying a first Nyquist zone.

A description of example embodiments follows. While the invention is defined solely by the claims presented at the end of this document and therefore may be susceptible to embodiment in different forms, there is shown in the drawings, and will be described herein in detail, one or more specific embodiments, with the understanding that the present disclosure is to be considered but one exemplification of the principles of the invention. It is also to be understood that there is no intent to limit the invention to that which is specifically illustrated and described herein. Therefore, any references to the "invention" which may occur in this document are to be interpreted only as a reference to one particular example embodiment of but one aspect of the invention(s) claimed.

A Time-Interleaved Analog-to-Digital Converter (TIADC) employs multiple analog-to-digital converters (ADCs) to achieve high sampling rates. Thus, in a TIADC employing M such ADCs, each ADC operates at $F_S/M$ where $F_S$ is the sampling rate of the TIADC. Ideally, the slower ADCs should have the same offset, gain, and uniform sample instants. In practice, however, due to component mismatches, this requirement is difficult to achieve. The differences in the offset values of the slower ADCs produce tones at $kF_S/M$, for $k=0, 1, 2, \ldots$, irrespective of the input signal. The differences in the gain values of the ADCs produce spurious (or unwanted) signals at $\pm F_{in}+kF_S/M$, for $k=1, 2, \ldots$, where $F_{in}$ is any frequency of the input signal. Similarly, the non-uniformity of sampling instants of each ADC with respect to the TIADC sampling frequency produce spurious signals at exactly the same location as the spurs due to gain mismatch. However, the spurs due to the sample-time mismatch are orthogonal to those due to the gain mismatch. Consequently, the resulting spurious signals due to offset, gain and sample-time mismatches degrade the performance of the TIADC system significantly, thus making the estimation and correction of these errors imperative to improve performance.

Here the focus is on a two-channel TIADC system wherein the sample-time (also referred to herein as phase) mismatch error is estimated and corrected. Expressions for the phase error have been developed wherein it is shown that the phase error produces image spurs reflected around the Nyquist frequency. In developing expressions for the phase error, it is assumed that the gain and offset mismatch errors have been corrected. For the sake of exposition, the relevant expressions are developed for a single sinusoidal input signal. It is also shown that the amplitude of this tone is commensurate with the amount of the phase error.

The expression for the phase error involves the cross-correlation between the two ADCs which is related to the phase mismatch between the two ADCs. It will be shown that the phase error depends on the Nyquist zone of the input signal. For instance, if the signal is in the first Nyquist zone, the slope of the phase error could be positive (negative) while the slope becomes negative (positive) when the signal occupies the second Nyquist zone. In applications where the input spectrum occupies different Nyquist zones at various time instants, the phase error slope toggles between negative and positive values. Consequently, any adaptation that is designed for a certain phase error slope tends to diverge when the sign of the phase error slope changes.

Here is presented an algorithm for phase correction that estimates the slope of the phase error continuously and accordingly changes the direction of adaptation of the algorithm. While the adaptive algorithm is essentially based on the sign of the phase error, the sense of adaptation is based on the sign of the slope estimate of the phase error. In other words, if the adaptive algorithm follows one direction of movement when the phase error slope is positive, it can be made to move in the opposite direction when the phase error slope is negative. In this way, the adaptive algorithm will always converge irrespective of the Nyquist zone of the input signal. The input signal to the two-channel TIADC system is itself the training signal and the estimation and correction of the phase error is carried out in the background. In other words, the adaptation is performed using a blind adaptive technique. The entire adaptation is, in a preferred embodiment, a mixed-signal process wherein the estimation of the phase error is carried out in the digital domain while the correction is carried out in the analog domain. Without loss of generality, assume that the estimation information in the digital domain is transferred to an appropriate correction in the analog domain by way of a look-up table (LUT). In the adaptation loop, for instance, a certain address to the LUT is calculated based on the phase error, in conjunction with the slope of the phase error, and the value corresponding to that address in the LUT is used in an appropriate analog circuit in the two-channel TIADC system to effect the correction.

Phase Error Correction

In this section, a two-channel TIADC system is considered with phase error only. It is assumed that the gain and phase mismatch errors have been corrected. Additionally, an input signal is assumed of the form $x(t)=\cos(2\pi F_i t+\phi)$, where $F_i$ is an arbitrary input frequency and $\phi$ is an arbitrary phase.

The output of the two-channel TIADC system is given by $$y(n) = \begin{cases} \cos(2\pi F_i nT + \phi) & n = \text{even} \\ \cos(2\pi F_i nT + \Delta t + \phi) & n = \text{odd} \end{cases} \quad (1)$$

where $T=1/F_S$ and $F_S$ is the sampling frequency of the two-channel TIADC system. Combining the even and odd time instants in the above equation, $$y(n) = \cos\left(2\pi F_i\left[nT + \frac{\Delta t}{2} - (-1)^n \frac{\Delta t}{2}\right] + \phi\right) \quad (2)$$

Assume that the outputs corresponding to even time instants are output from ADC1 while those corresponding to odd time instants are output from ADC2. In other words, ADC1 samples the input signal at time instants $2nT$ while ADC2 samples the input signal at time instants $(2n+1)T+\Delta t$. Consequently, $\Delta t$ is the sample-time error. It should be mentioned that there is no loss of generality in grouping the total phase in one of the outputs.

The above equation (2) can thus be expanded as $$y(n) = \cos\left(2\pi F_i\left[nT + \frac{\Delta t}{2}\right] + \phi\right) \cos((-1)^n \pi F_i \Delta t) + \quad (3)$$
$$\sin\left(2\pi F_i\left[nT + \frac{\Delta t}{2}\right] + \phi\right) \sin((-1)^n \pi F_i \Delta t)$$

It can be seen that $\cos((-1)^n \pi F_i \Delta t) = \cos(\pi F_i \Delta t)$. Since $\sin(\ )$ is an odd function, with $(-1)^n = \cos(n\pi)$, then $\sin((-1)^n \pi F_i \Delta t) = \cos(n\pi)\sin(\pi F_i \Delta t)$. Using $\sin(a)\cos(n\pi) = \sin(a-n\pi)$ and $n\pi = \pi F_S nT$, the above equation can be written as $$\begin{aligned} y(n) =\ & \cos(\pi F_i \Delta t) \cos(2\pi F_i nT + \pi F_i \Delta t + \phi) + \\ & \sin(\pi F_i \Delta t) \sin(2\pi F_i nT + \pi F_i \Delta t - \pi F_s nT + \phi) \\ =\ & \cos(\pi F_i \Delta t) \cos(2\pi F_i nT + \pi F_i \Delta t + \phi) + \\ & \sin(\pi F_i \Delta t) \sin((2\pi F_i - \pi F_s)nT + \pi F_i \Delta t + \phi) \end{aligned} \quad (4)$$

Assuming that $\Delta t$ is very small compared to T, $\cos(\pi F_i \Delta t) \approx 1$ and $\sin(\pi F_i \Delta t) \approx \pi F_i \Delta t$. Consequently, $$y(n) \approx \cos(2\pi F_i nT + \pi F_i \Delta t + \phi) + \tag{5}$$
$$(\pi F_i \Delta t) \sin((2\pi F_i - \pi F_s)nT + \pi F_i \Delta t + \phi)$$
$$\approx \underbrace{\cos(2\pi F_i nT + \pi F_i \Delta t + \phi)}_{Input}$$

$$- \underbrace{(\pi F_i \Delta t) \sin((\pi F_s - 2\pi F_i)nT - \pi F_i \Delta t - \phi)}_{Image} \tag{6}$$

It can now be seen from the above equation that the phase error produces an image tone with an amplitude proportional to the sample mismatch timing $\Delta t$.

As is well known, a correlation between two sequences provides information about the time delay between them. Towards this end, define two sequences, $y_1(n)$ and $y_2(n)$, as the outputs from ADC1 and ADC2, respectively. Consequently $$y_1(n) = y(2n) \tag{7}$$

$$y_2(n) = y(2n+1) \tag{8}$$

Now define a phase error as a function of the timing mismatch as $$e_{phase}(\Delta t) = \frac{1}{N} \sum_{k=1}^{N-1} \{y_1(n-1-k)y_2(n-1-k) - \tag{9}$$
$$y_2(n-1-k)y_1(n-k)\}$$
$$= \frac{1}{N} \sum_{k=1}^{N-1} y_2(n-1-k)\{y_1(n-1-k) - y_1(n-k)\}$$

where N is the number of samples from both ADCs used in the evaluation of $e_{phase}(\Delta t)$. The above equation can also be written as $$e_{phase}(\Delta t) = \frac{1}{N} \sum_{k=0}^{N-2} \{y_1(n-k)y_2(n-k)y_1(n-1-k)\} \tag{10}$$
$$= \frac{1}{N} \sum_{k=0}^{N-2} y_2(n-k)\{y_1(n-k) - y_1(n-1-k)\}$$

An alternative expression for the phase error given by $$e_{phase}(\Delta t) = \frac{1}{N} \sum_{k=1}^{N-1} \{y_1(n-1-k) - y_2(n-1-k)\}^2 - \tag{11}$$
$$\{y_2(n-1-k) - y_1(n-k)\}^2$$

also provides information about the phase error between the two ADCs. Again Eqn 11 can also be written as $$e_{phase}(\Delta t) = \frac{1}{N} \sum_{k=0}^{N-2} \{y_1(n-k) - y_2(n-k)\}^2 - \tag{12}$$
$$\{y_2(n-k) - y_1(n-1-k)\}^2$$

Yet another expression for the phase error can written as $$e_{phase}(\Delta t) = \frac{1}{N} \sum_{k=1}^{N-1} |y_1(n-1-k) - y_2(n-1-k)| - \tag{13}$$
$$|y_2(n-1-k) - y_1(n-k)|$$

or, alternatively, $$e_{phase}(\Delta t) = \frac{1}{N} \sum_{k=0}^{N-2} |y_1(n-k) - y_2(n-k)| - \tag{14}$$
$$|y_2(n-k) - y_1(n-1-k)|$$

Now look at the variation of the phase error with sampling time mismatch in different Nyquist zones. As an example, consider a sinusoidal signal of 90 MHz with a sampling frequency $F_S$=500 MHz. It can be noted that the input signal is in the first Nyquist zone. The spectrum of such a signal is shown in FIG. 1. In this spectrum is also seen a strong tone at 160 MHz. This is an image spur created due to sample-time mismatch.

Figure 2:
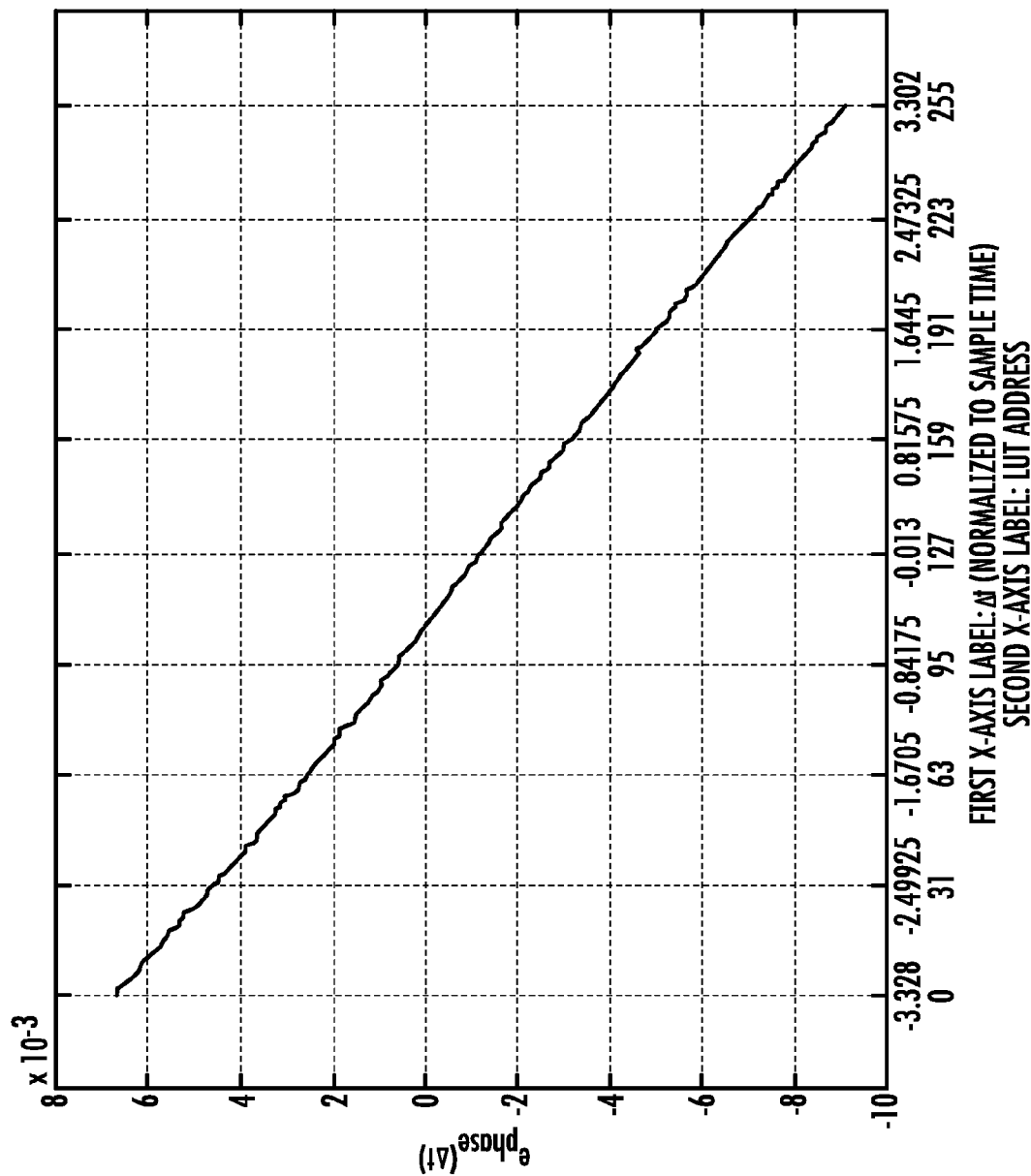
FIG. 2 illustrates variation of $e_{phase}(\Delta t)$ with $\Delta t$ for the input signal illustrated in FIG. 1.
Figure 3:
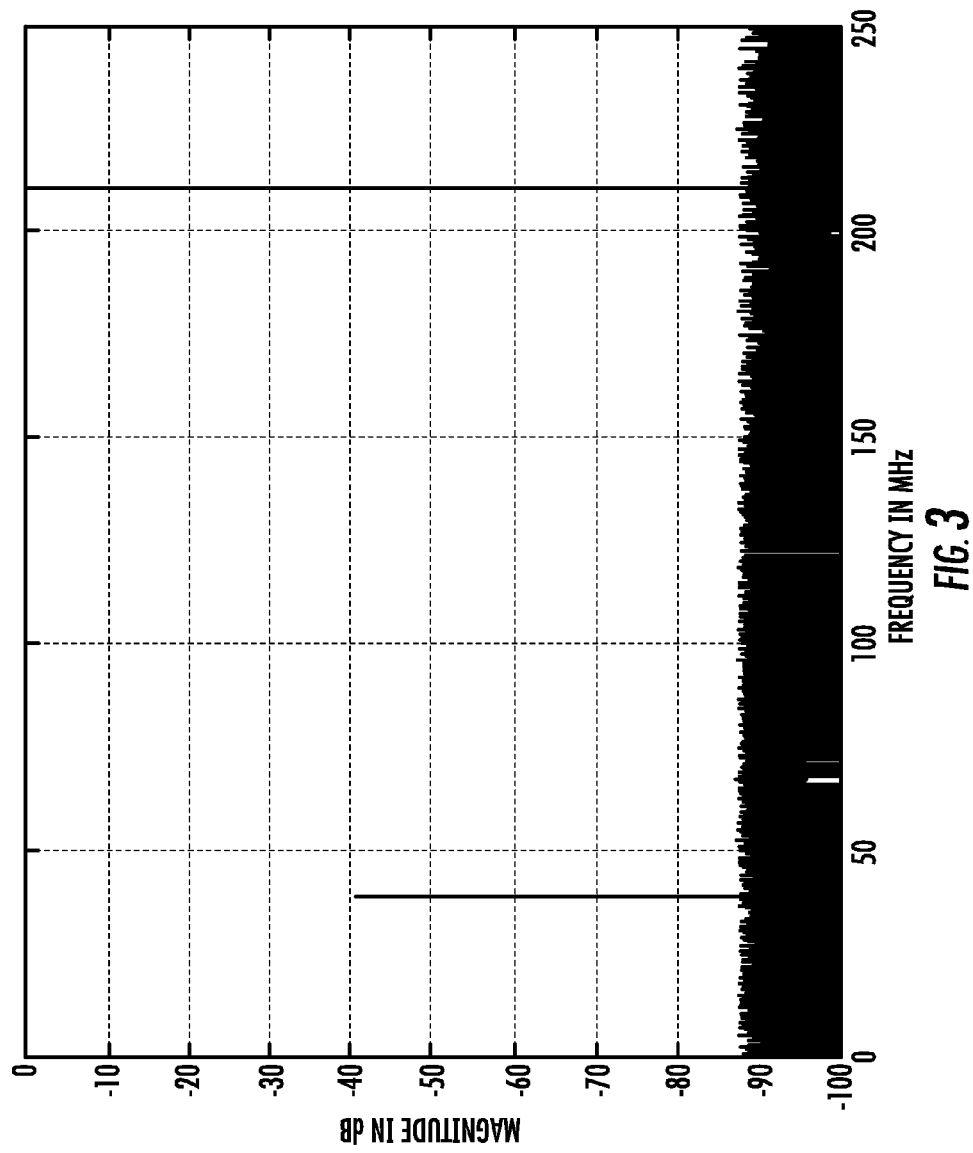
FIG. 3 illustrates a spectrum of an input signal occupying a second Nyquist zone.

For the sake of exposition, choose the phase error equation characterized by Eqn. 9. FIG. 2 shows the variation of $e_{phase}(\Delta t)$ with $\Delta t$ as a fraction of the sampling time of the TIADC for this signal. Next, consider a signal in the second Nyquist zone. For this, choose a sinusoidal signal of 290 MHz with the same sampling frequency mentioned earlier. The spectrum of the aliased signal is shown in FIG. 3. The strong tone at 40 MHz is the image spur due to sample-time mismatch.

Figure 4:
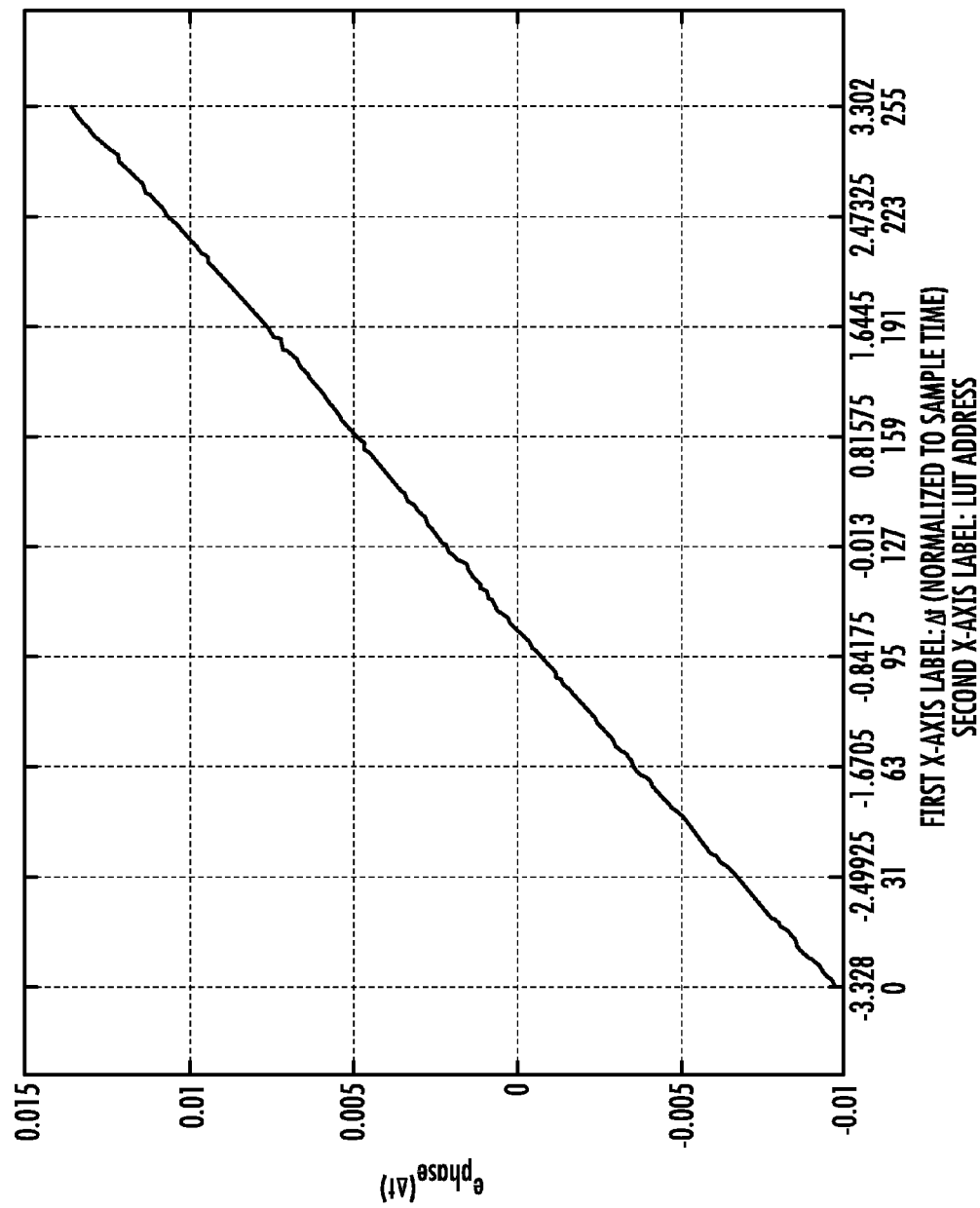
FIG. 4 illustrates variation of $e_{phase}(\Delta t)$ with $\Delta t$ for the signal shown in FIG. 3.

FIG. 4 shows the variation of $e_{phase}(\Delta t)$ for the signal in the second Nyquist zone. As can be seen from FIG. 4, the slope of the phase error is opposite to that of the phase error shown in FIG. 2.

Now assume an adaptive algorithm based on the sign of the phase error, viz., sign($e_{phase}(\Delta t)$). Looking at FIG. 2, it can be seen that the adaptive algorithm will move to the right when sign($e_{phase}(\Delta t)$) is negative and move to the left when sign ($e_{phase}(\Delta t)$) is positive. In this way, the adaptive algorithm will converge to a timing mismatch value for which $e_{phase}(\Delta t) \approx 0$. Now apply this algorithm for the case when the input signal is in the second Nyquist zone.

From FIG. 4 it can also be seen that an adaptive algorithm will "move to the right" when sign($e_{phase}(\Delta t)$) is negative and move to the left when sign($e_{phase}(\Delta t)$) is positive. This results in divergence of the algorithm. Thus, the adaptive algorithm should take into account the slope of the phase error. Towards this end, presented here is a method of evaluating the slope of the phase error using a technique called gradient (or slope) filtering.

Assume P values of $e_{phase}(\Delta t_k)$ corresponding to $\Delta t_k$ are available. Using the procedure from linear regression, one can fit a line through these points with an equation given by $e_p = a + m\Delta t$ where a is the intercept given by $$a = \frac{(\sum_k e_{phase}(\Delta t_k))(\sum_k \Delta t_k^2) - (\sum_k \Delta t_k)(\sum_k e_{phase}(\Delta t_k)\Delta t_k)}{P(\sum_k \Delta t_k^2) - (\sum_k \Delta t_k)^2} \tag{15}$$

and the slope m given by $$m = \frac{P\left(\sum_k e_{phase}(\Delta t_k)\Delta t_k\right) - \left(\sum_k \Delta t_k\right)\left(\sum_k e_{phase}(\Delta t_k)\right)}{P\left(\sum_k \Delta t_k^2\right) - \left(\sum_k \Delta t_k\right)^2} \quad (16)$$

It should be mentioned that what really is of interest here is the sign of m since the direction of adaptation is controlled by it. Thus, irrespective of the Nyquist zone of the input signal, an adaptive algorithm based on the product of sign($e_{phase}(\Delta t_k)$) and sign(m) will always converge.

By choosing an anti-symmetric distribution of $\Delta t_k$ around zero, $\Sigma_k \Delta t_k = 0$. Thus Eqn. 16 can be written as $$m = \frac{\sum_k e_{phase}(\Delta t_k)\Delta t_k}{\sum_k \Delta t_k^2} \quad (17)$$

The denominator in the above equation is always positive and hence the sign of m can be written as $$m_s = \text{sign}(m) = \text{sign}\left(\sum_k e_{phase}(\Delta t_k)\Delta t_k\right) \quad (18)$$

Therefore, knowing P ordered pair values of ($e_{phase}(\Delta t_k)$, $\Delta t_k$), one can obtain the sign of m. If one chooses P to be odd, $$\Delta t_k = k - \frac{P-1}{2}, \text{ for } k = 0, 1, \cdots, P-1 \quad (19)$$

On the other hand if P is chosen to be even, $$\Delta t_k = 2k - (P-1), \text{ for } k = 0, 1, \ldots, P-1 \quad (20)$$

It can be noted that the values of $\Delta t_k$ for both odd and even values of P are anti-symmetric and can thus form the coefficients of a linear-phase finite impulse response (FIR) filter. Consequently only half the values of $\Delta t_k$ are sufficient to obtain the sign of m. Also, from a practical implementation perspective, the value of P should be kept small in order for the adaptive algorithm to quickly adjust to changes in the sign of the phase error slope.

It is now possible to provide an adaptive algorithm based on the product of the signs of ($e_{phase}(\Delta t_k)$) and m to compensate sample time mismatch errors.

Algorithm for Sample Time Mismatch

Figure 5:
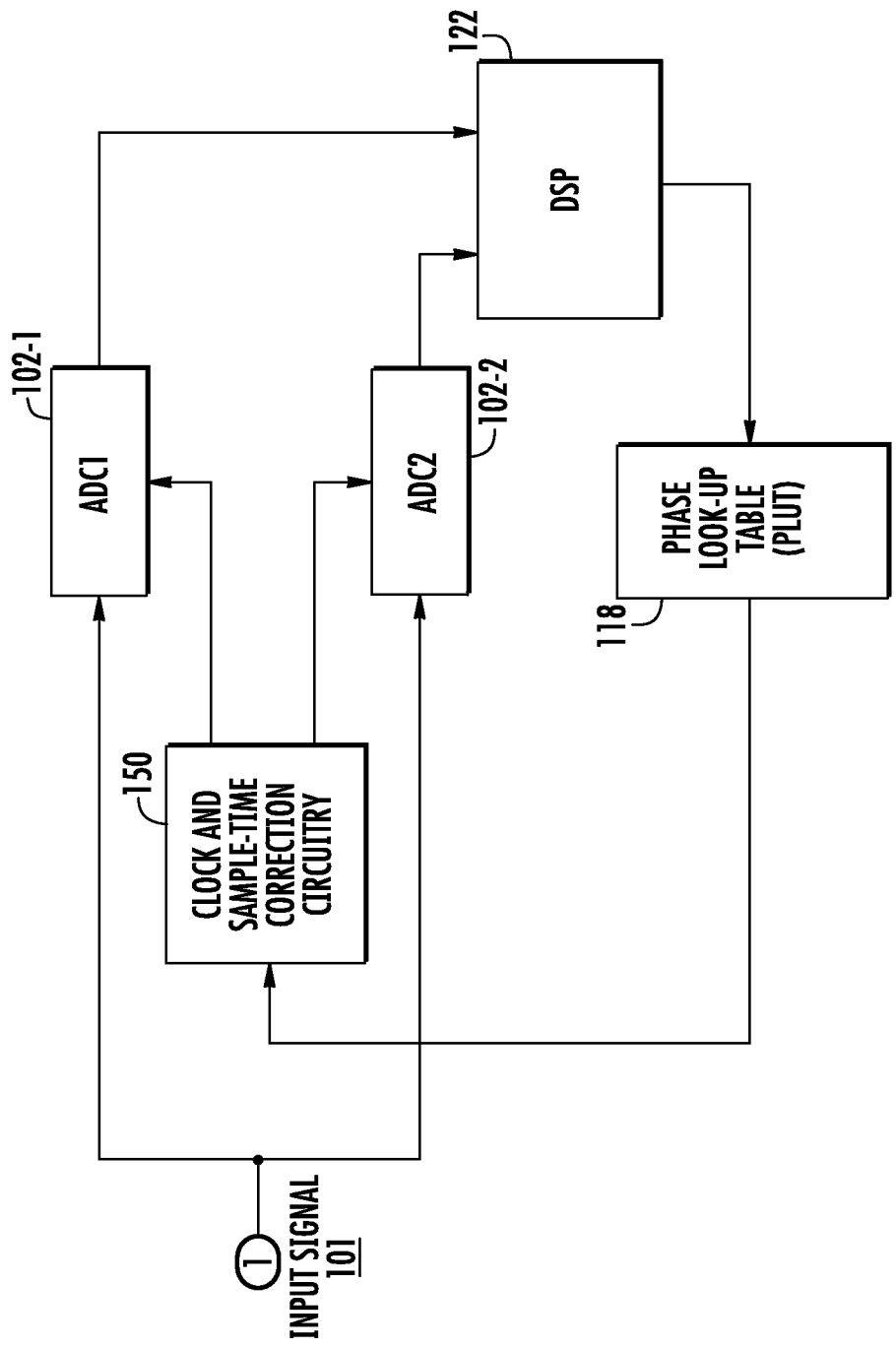
FIG. 5 is a schematic of a Two-Channel Time Interleaved of sample-time mismatch correction.

A simple schematic for a two-channel TIADC that implements sample-time correction is shown in FIG. 5. The clock circuitry 150 is such that two ADC cores, viz., ADC1 102-1 and ADC2 102-2, sample the input signal 101 at $F_S/2$. In other words, for a clock running at $F_S$, ADC1 102-1 samples at odd sample clock instants (say) while ADC2 102-2 samples the input signal 101 at even sample clock instants. The samples from ADC1 102-1 and ADC2 102-2 are collected by a Digital Signal Processor (DSP) 122 and the phase error is evaluated at regular intervals. The DSP 122 then runs an adaptive algorithm determining the sign of the phase error in conjunction with the sign of the gradient of the phase error to feed a Phase Look Up Table (LUT) 118 with a sample time correction input.

Figure 6:
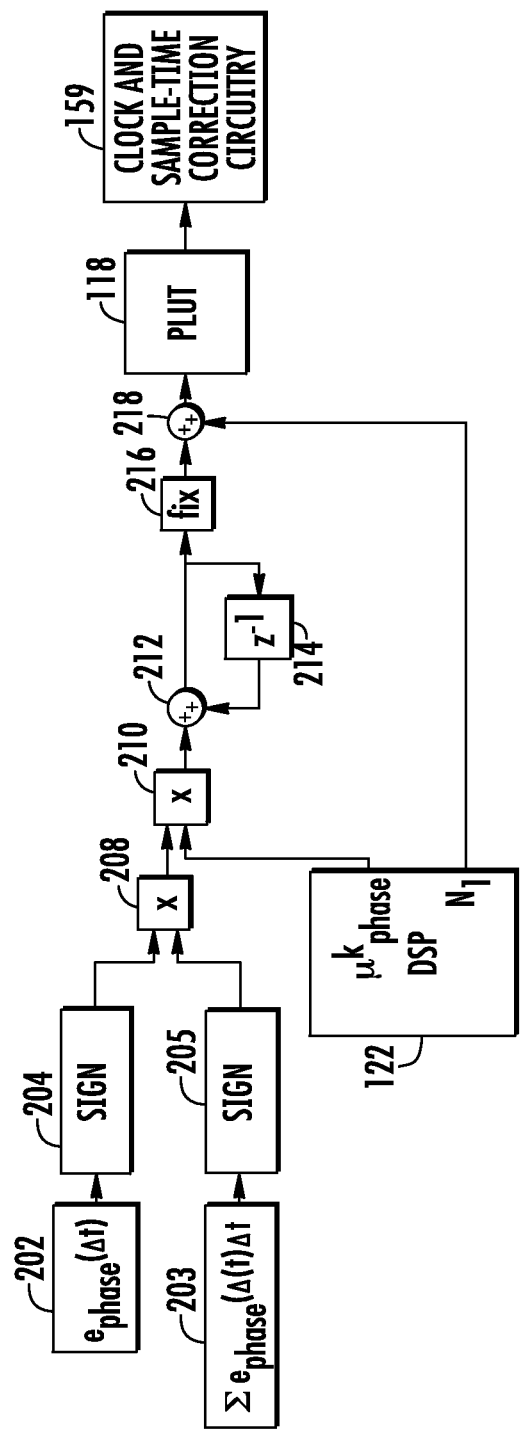
FIG. 6 illustrates a block diagram of an adaptive phase error algorithm.

A block diagram that effects the adaptive algorithm in shown in FIG. 6. Generally speaking, the output of the adaptive algorithm forms the address to the Phase LUT (PLUT) 118. The output of the PLUT 118 then directly or indirectly provides the corresponding sample-time correction to the clock and sample-time correction circuitry 150.

Assume the size of PLUT 118 to be $N_{phase}$. If the maximum phase mismatch between the two ADCs 102-1, 102-2 is $\pm X_p$, then the entries of the PLUT 118 will directly or indirectly cover the range $[-X_p, X_p]$ units. The distribution of the entries in PLUT 118 can be linear, logarithmic or based on any other distribution depending upon the characteristics of the analog circuits effecting the correction.

Let $PLUT^k$ denote the address of PLUT 118 at the $k^{th}$ iteration. Let $\mu^k$ denote a variable at the $k^{th}$ iteration, and let $\mu_{phase}^k$ denote a step size for the adaptive algorithm at the $k^{th}$ iteration. Here, assume $$\mu_{phase}^k \in [\mu_{phasemin}, \mu_{phasemax}] \quad (21)$$

where $\mu_{phasemin}$ and $\mu_{phasemax}$ are the minimum and maximum values, respectively, of $\mu_{phase}^k$. The adaptive algorithm for correcting the phase error can thus be written as $$PLUT^k = N_i + \lfloor \mu^k \rfloor \quad (22)$$

$$\mu^{k+1} = \mu^k - \text{sign}(e_{phase}^k(\Delta t)) \, \text{sign}(m_s^k)\mu_{phase}^k \quad (23)$$

$$\mu_{phase}^{k+1} = \max\left(\frac{\mu_{phase}^k}{2}, \mu_{phasemin}\right) \text{ if mod } (k, k_p) \quad (24)$$
$$= 0$$

where $N_i$ is the initial address of the PLUT (say $N_{phase}/2$), $\mu^0 = 0$, $\mu_{phase}^0 = \mu_{phase}$ and $k_p$ is any arbitrary positive number.

The value of $N_i$ also serves as a bias for the address input to the PLUT 118. Since the address of the PLUT ranges from 0 to $N_{phase}-1$, only positive values of are allowed. Thus $\mu^k$ can be negative or positive while $N_i$ is chosen such that $PLUT^k \in [0\ N_{phase}-1]$. It should be mentioned that $e_{phase}^k(\Delta t)$ is evaluated using Eqn. 9 and $m_s^k$ is evaluated using Eqn. 18. Since $PLUT^k$ refers to an address of PLUT, the update happens only when $\mu^k$ changes by an integer value in Eqn. 22. Consequently $m_s^k$ is also evaluated at such instants when $\mu^k$ changes by an integer value. At convergence, $PLUT^k$ indicates the optimal address of PLUT that results in the minimum value of $e_{phase}(\Delta t)$.

More particularly now, the algorithm uses the values $e_{phase}(\Delta t_k)$ 202 and a running sum of the values of the slope m 203 (e.g., $e_{phase}(\Delta t_k)\Delta t_k$) as inputs. Next, a pair of sign blocks 204, 205 determine the signs of the phase and slope of the phase. The signs are multiplied (which can be implemented by XOR block 208) and them multiplied 210 again by a Phase LUT step size amount, $\mu^k$.

This signal is then fed to a filter implemented by the sum block 212 and delay 214. This arrangement provides a Finite Impulse Response (FIR) filter; it will be understood that other types of digital filters can be used, such as Infinite Impulse Response (IIR), combination FIR/IIR or other type of digital filters. A FIX block 216 then selects the integer part (e.g., the fixed point part) of the floating point filter output. These integer values are then summed 218 with $N_i$ to determine the input address to the PLUT 118.

Experimental Results

Presented next are some experimental results based on the output of a two-channel TIADC integrated circuit. In the first experiment, a sinusoidal signal with a frequency of 90 MHz was used. The sampling frequency of the two-channel TIADC system was 500 MHz. The adaptive algorithm mentioned above was then run on the output of the two ADCs.

Figure 7:
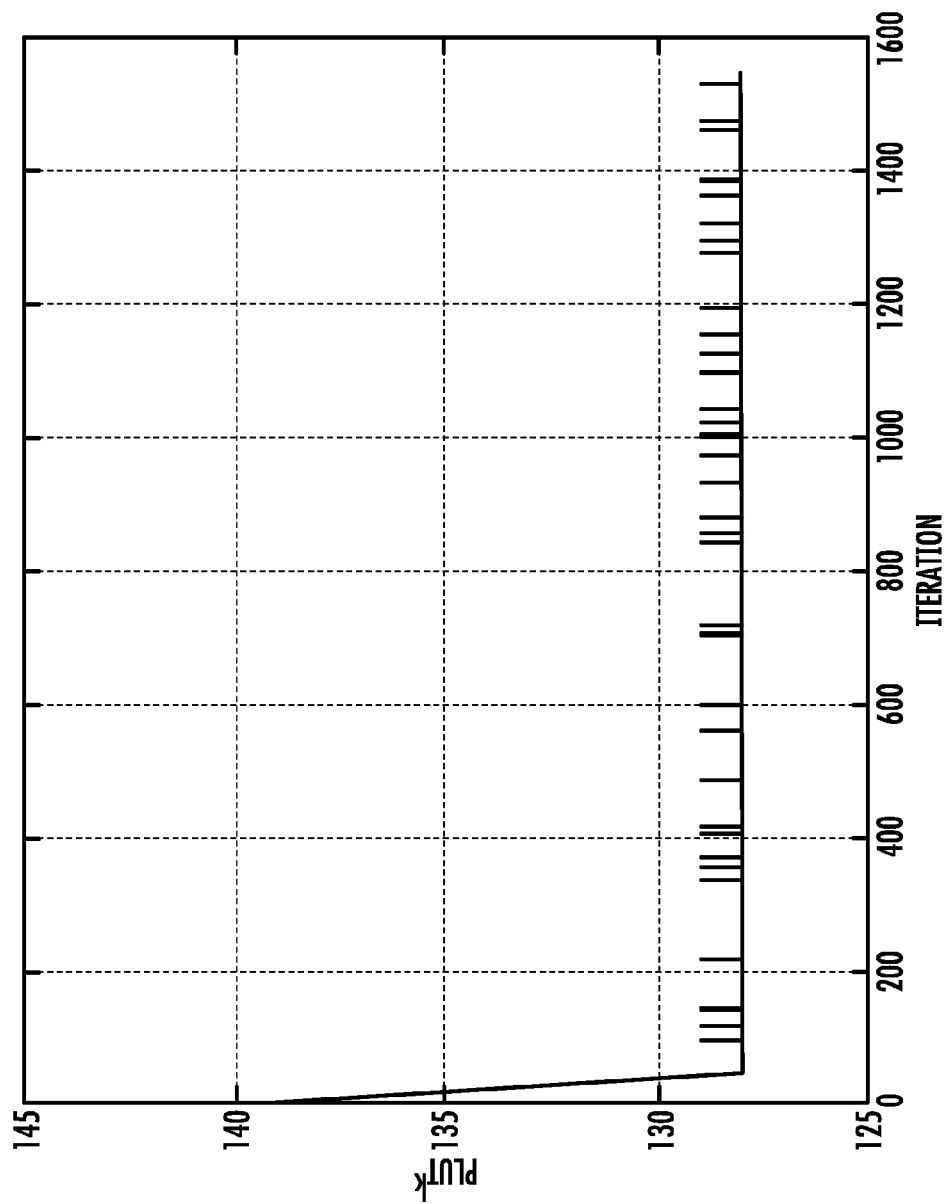
FIG. 7 illustrates variation of $PLUT^k$ with iteration k when the input signal is in the first Nyquist zone.

FIG. 7 shows the convergence of $PLUT^k$ with iteration k, assuming $N_{phase}$=256 and P=5. As can be seen from the figure, the $PLUT^k$ converges to a value between 127 and 128, which are the addresses corresponding to the vicinity of the minimum value of $e_{phase}(\Delta t)$. In order to verify the convergence, it can be noted from FIG. 2 that $e_{phase}(\Delta t)$ cross zero between 127 and 128. This confirms the convergence of the adaptive algorithm.

Figure 8:
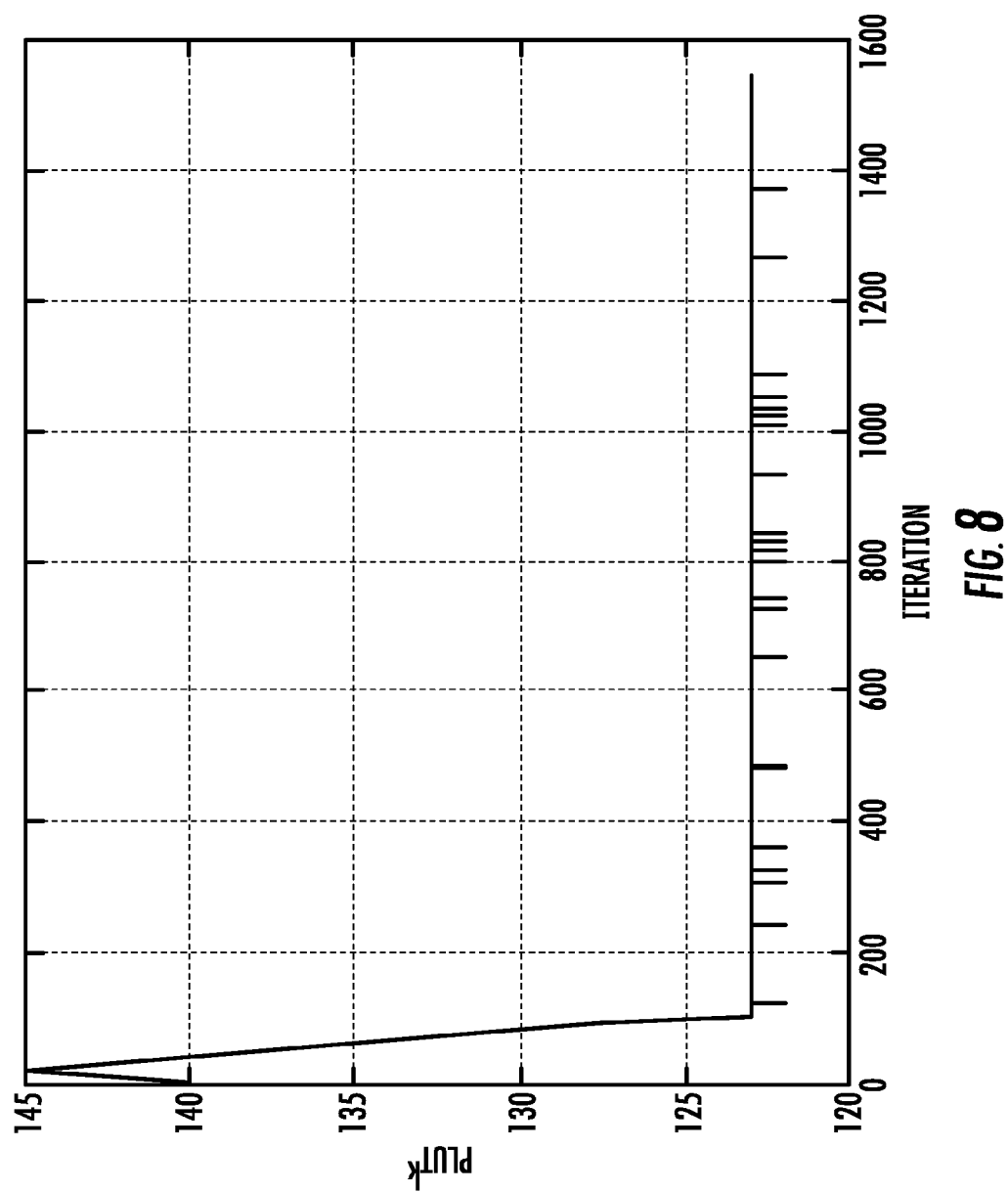
FIG. 8 illustrates variation of $PLUT^k$ with iteration k when the input signal is in the second Nyquist zone.

In the second experiment, a sinusoidal signal with a frequency of 290 MHz was used as the input. As can be noted, the input signal is in the second Nyquist zone. FIG. 8 shows the convergence of $PLUT^k$ with iteration k. In this figure it can be seen that the algorithm diverges first before converging to the minimum value of $e_{phase}(\Delta t)$, which corresponds to an address location of the PLUT between 122 and 123. The reason for divergence is that it requires P values of $e_{phase}(\Delta t)$ before the gradient of the phase error is evaluated. Once the slope is evaluated, the adaptive algorithm then moves in the correct direction to converge. This convergence can be verified from FIG. 4 where $e_{phase}(\Delta t)$ crosses zero between these address values.

Figure 9:
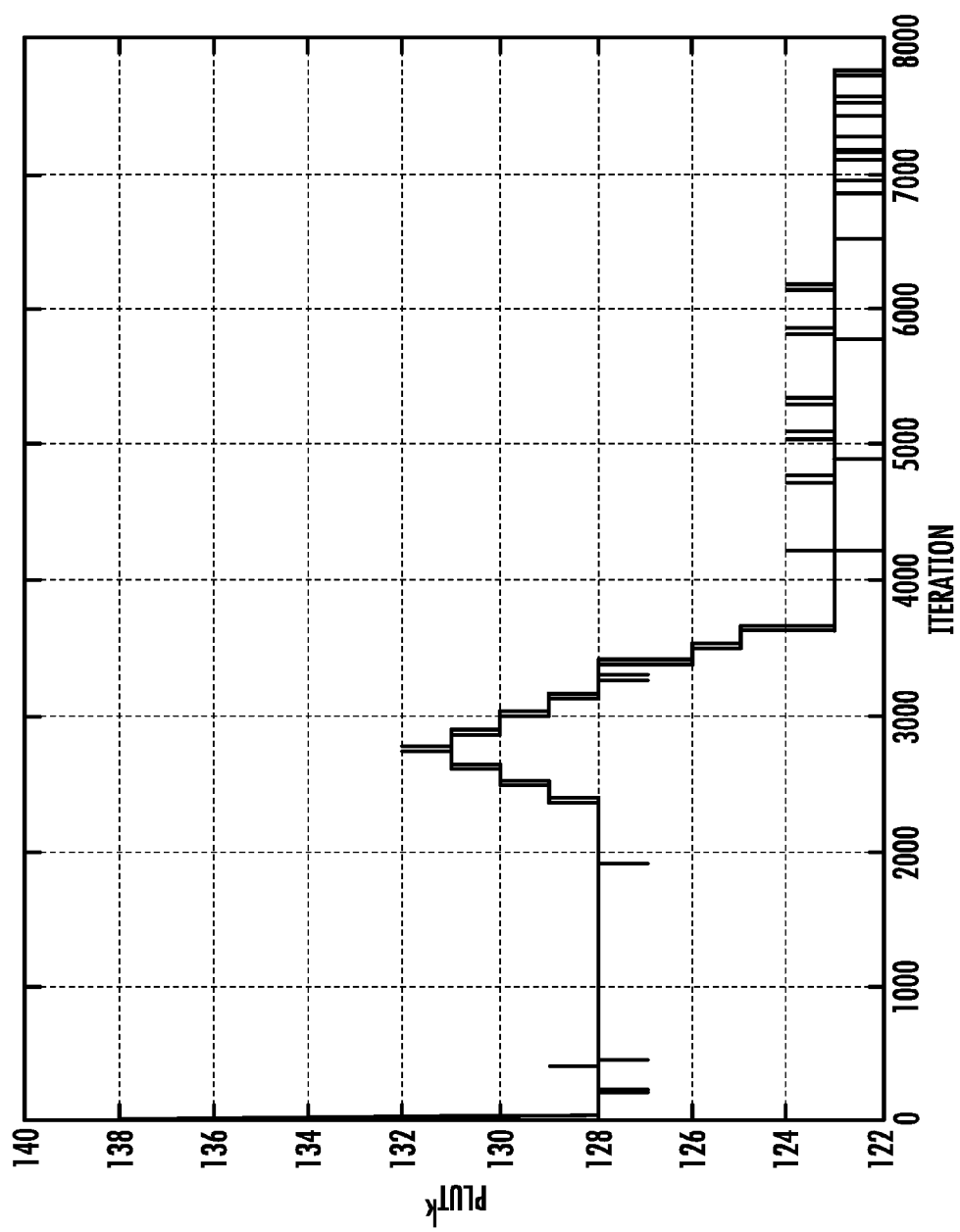
FIG. 9 illustrates variation of $PLUT^k$ with iteration k when the input signal switches between first and second Nyquist zones.

The robustness of this algorithm is seen when the input signal switches Nyquist zones. For this experiment, the input signal was a 90 MHz tone for sometime and then switched to a 290 MHz tone. FIG. 9 shows the convergence of $PLUT^k$ with iteration k. It can be seen that the algorithm settles to a PLUT address between 127 and 128 as long as the input is a 90 MHz tone. When the input changes from 90 MHz tone to a 290 MHz tone, the algorithm first moves in the wrong direction for a maximum of P points before it moves in the correct direction. This is because it needs a maximum of P phase error values to evaluate the gradient of the phase error. Once the correct direction is established, the algorithm moves towards the optimal address of PLUT, which is around 123. It can thus be seen that the adaptive algorithm is robust irrespective of the Nyquist zone occupied by the input signal.

Use in a Digital System

The above teachings with respect to analog to digital converters have wide application in the filed of electronic devices and systems. One example system is a digital signal transceiver. In such a system, the receiver may include front end analog signal processing components such as amplifiers, filters, and downconverters. A time interleaved analog to digital converter uses two or more subunit converters to provide a digital signal representative of the received signal(s) of interest. Digitizing the entire receive bandwidth of interest may require a very high sampling rate; therefore, an interleaved system as described above may provide advantages over other conversion techniques.

Figure 10:
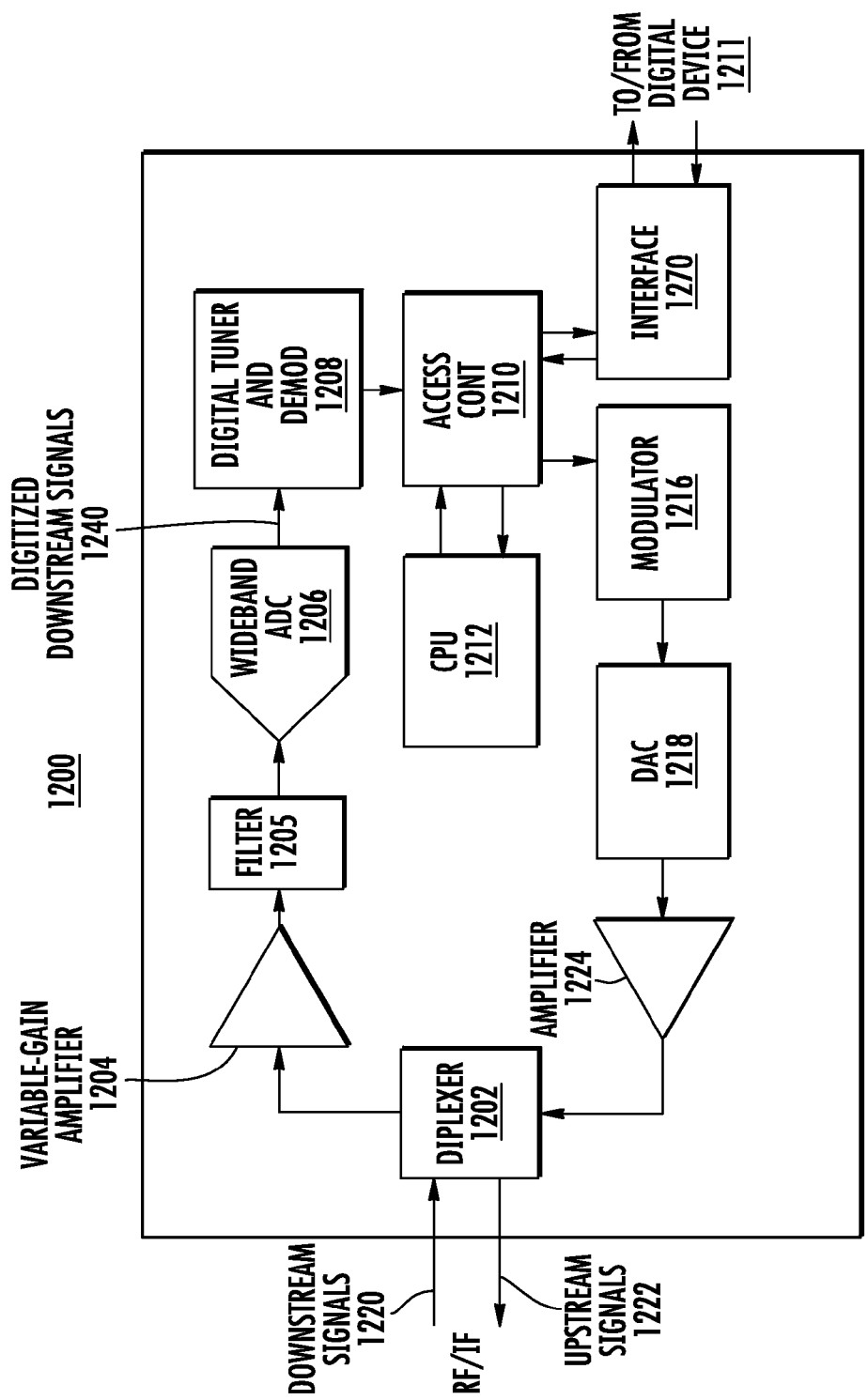
FIG. 10 illustrates use of the TIADC in a digital transceiver.

FIG. 10 shows one such example transceiver system 1200 connected to transmit and receive a Radio Frequency (RF) signal. The RF signal may be a wireless signal received from an antenna or maybe received on a wire such as from a coaxial, optical fiber, or its like. The transceiver 1200 transmits data to and receives data from a digital device 1211 such as a computer, telephone, television, camera or any number of digital devices.

The transceiver 1200 shown in FIG. 10 uses a wideband, time-interleaved, analog-to-digital converter (ADC) 1206 as taught herein to digitize received signals. The output from the wideband ADC 1206 can be tuned digitally, rather than with analog tuners, resulting in lower power consumption compared to alternative methods.

More particularly, in the example system 1200, signals are coupled via a diplexer 1202, which separates downstream (received) signals 1220 from upstream (transmitted) signals 1222. The diplexer 1202 directs the received signal to a variable-gain amplifier (VGA) 1204, which amplifies the received signal before transmitting it through a filter 1205 to a wideband ADC 1206. The time-interleaved ADC 1206 digitizes the received signal, then passes the digitized signal 1240 to a digital tuner and demodulator 1208. These demodulated signals may then be fed through access control 1210 and then to a digital interface 1270.

A complete digital transceiver 1200 also typically includes corresponding transmit components such as modulator 1216, digital to a converter 1218 and amplifier 1224. A CPU internal to the transceiver 1200 may further control its operation. It should also be understood that other components not shown here, such as up converters and down converters may form part of transceiver 1200.

Those of skill will further appreciate that the various illustrative components, logical blocks, signal processing blocks, modules, circuits, and algorithm steps described in connection with the embodiments disclosed above may be implemented as analog or digital electronic hardware, or as computer software, or as combinations of the same. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

The various illustrative components, logical blocks, modules, and circuits described in connection with the embodiments disclosed herein may be implemented or performed with general purpose processors, digital signal processors (DSPs) or other logic devices, application specific integrated circuits (ASICs), field programmable gate arrays (FPGAs), discrete gates or transistor logic, discrete hardware components, or any combination thereof designed to perform the functions described herein. A general purpose processor may be any conventional processor, controller, microcontroller, state machine or the like. A processor may also be implemented as a combination of computing devices, e.g., a combination of a DSP and a microprocessor, a plurality of microprocessors, one or more microprocessors in conjunction with a DSP core, or any other such configuration.

The steps of the methods or algorithms described in connection with the embodiments disclosed herein may be embodied directly in hardware, in software or firmware modules executed by a processor, or in a combination thereof. A software product may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC.

CONCLUSION

In this disclosure a robust method for correcting the phase error in a two-channel TIADC system that is independent of the Nyquist zone occupied by the input signal has been described. The adaptive algorithm is based on estimating the gradient of the phase error using a filter. The coefficients of the filter can be derived from a simplified expression of linear regression. The direction of the adaptation is controlled by the sign of the gradient. The adaptive algorithm converges to the optimal value irrespective of the Nyquist zone occupied by the input signal. The efficacy of the adaptive algorithm was shown by way of experimental results based on a two-channel TIADC.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

While this invention has been particularly shown and described with references to example embodiments thereof, it will be understood by those skilled in the art that various changes in form and details may be made therein without departing from the scope of the invention encompassed by the appended claims.

What is claimed is:

1. A method comprising:
analog-to-digital (ADC) converting an analog input signal to provide to a set of two ADC outputs as first and second digital signals;
estimating a sample time error from the first and second digital signals;
determining a correction signal from the sample time error regardless of a Nyquist zone occupied by the analog input signal; and
applying the correction signal to the analog-to-digital converting step.

2. The method of claim 1 wherein the step of determining the correction signal comprises estimating a gradient of the sample time error.

3. The method of claim 2 wherein determining the correction signal further comprises determining a sign of the gradient of the sample time error.

4. The method of claim 3 wherein determining the correction signal further comprises filtering the sign of the gradient of the sample time error.

5. The method of claim 1 wherein the sample time error is a digital value and the correction signal is an analog signal.

6. The method of claim 1 further comprising:
looking up the correction signal in stored value lookup table.

7. The method of claim 1 wherein the step of determining the correction signal from the sample time value regardless of a Nyquist zone occupied by the analog input signal is determined from a gradient of the sample time error, and that gradient is then used in determining the correction signal.

8. The method of claim 1 wherein the step of determining a correction signal error further comprises:
storing correction values in a Phase Look Up Table (PLUT) where $$PLUT^k = N_i + \lfloor \mu^k \rfloor$$

$$\mu^{k+1} = \mu^k - \text{sign}(e_{phase}^k(\Delta t)) \ \text{sign}(m_s^k) \mu_{phase}^k$$

$$\mu_{phase}^{k+1} = \max\left(\frac{\mu_{phase}^k}{2}, \mu_{phasemin}\right) \text{ if mod } (k, k_p)$$

$$= 0$$

such that $N_i$ is an initial address offset of the PLUT, $\mu^k$ denotes a variable at the $k^{th}$ iteration, and $\mu_{phase}^k$ denotes a step size at the $k^{th}$ iteration $\mu_{phase}^0 = \mu_{phasemax}$, $k_p$ is any arbitrary positive number, and $e_{phase}(\Delta t_k)$ is an estimate of the phase error at iteration k.

9. The method of claim 8 further comprising:
filtering an input to the PLUT.

10. The method of claim 1 additionally comprising:
interleaving the first and second digital signals to form a digital converter representation of the analog input signal.

11. The method of claim 4 wherein the filtering step is a Finite Impulse Response (FIR) filtering step.

12. An apparatus comprising:
two or more Time-Interleaved Analog to Digital Converter (TIADC) cores, providing a set of two ADC outputs as first and second digital signals, at least one of the TIADC cores having a correction input;
a signal interleaver for combining the first and second digital signals to form a digital converted representation of the input signal;
a digital signal processing operator, for
estimating a phase error estimate from the first and second digital signals to provide a phase error estimate; and
determining a correction signal from the phase error estimate regardless of a Nyquist zone occupied by the input signal; and
the correction signal being connected to the sample time correction input of at least one of the TIADC cores.

13. An apparatus comprising:
two or more Time-Interleaved Analog to Digital Converter (TIADC) cores, providing a set of two ADC outputs as first and second digital signals, at least one of the TIADC cores having a correction input;
a signal interleaver for combining the first and second digital signals to form a digital converted representation of the input signal;
a digital signal processing operator, for
estimating a phase error estimate from the first and second digital signals to provide a phase error estimate; and
determining a correction signal from the phase error estimate regardless of a Nyquist zone occupied by the input signal; and
the correction signal being connected to the sample time correction input of at least one of the TIADC cores,
the apparatus additionally comprising:
a slope detector, for determining a slope of the phase error estimate.

14. The apparatus of claim 13 further comprising:
a sign operation to determine a sign of the slop of the phase error estimate.

15. The apparatus of claim 14 further comprising:
a Finite Impulse Response (FIR) filter for filtering a sign of the gradient of the phase error.

16. The apparatus of claim 13 wherein the phase error estimate is a digital value and the correction signal is an analog signal.

17. The apparatus of claim 13 additionally comprising a Look Up Table for providing the correction signal.

18. The apparatus of claim 13 additionally wherein the correction value is determined by slope detector that further determines a value indicative of a Nyquist zone occupied by the input signal from a slope of the phase error estimate.

19. The apparatus of claim 13 additionally comprising a Phase Look Up Table (PLUT) for determining the correction signal where $$PLUT^k = N_i + \lfloor \mu^k \rfloor$$
$$\mu^{k+1} = \mu^k - \text{sign}(e^k_{phase}(\Delta t))\, \text{sign}(m^k_s)\mu^k_{phase}$$
$$\mu^{k+1}_{phase} = \max\left(\frac{\mu^k_{phase}}{2}, \mu_{phasemin}\right) \text{ if mod }(k, k_p)$$
$$= 0$$

where $N_i$ is an initial address offset of the PLUT, $\mu^k$ denotes a variable at the $k^{th}$ iteration, and $\mu_{phase}^k$ denotes a step size at the $k^{th}$ iteration, $\mu_{phase}^0 = \mu_{phasemax}$, $k_p$ is any arbitrary positive number, and $e_{phase}(\Delta t_k)$ is an estimate of the phase error at iteration k.

20. The apparatus of claim 19 additionally comprising a filter for processing an input to the PLUT.

21. A programmable computer product for use with a multiple channel time interleaved analog to digital converter, wherein first and second digital signals are interleaved to form a digital converted representation of an input signal, the product comprising one or more programmable data processing machines that retrieve instructions stored on a non-transitioning computer readable medium and the one or more programmable data processing machines executing the the instructions, the instructions for:

receiving first and second digital signals;
estimating a sample time error from the first and second digital signals;
determining a correction signal from the sample time error regardless of a Nyquist zone occupied by the input signal; and
outputting the correction signal.

22. A communication system comprising:
a communication signal receiver, for receiving an input signal;
an analog to digital converter (ADC) connected to the receiver, for producing a digital input signal; and
a demodulator, for digitally demodulating the digital input signal;
wheren the ADC further comprises:
two or more time interleaved ADC cores, providing at least first and second digital signals, at least one ADC core having a correction input;
a digital signal processor for:
determining a phase error estimate from the first and second digital signals; and
producing a correction signal from the phase error estimate regardless of any Nyquist zone(s) occupied by the first and second digital signals.

23. The method of claim 1 wherein the Nyquist zone occupied by the analog signal input includes at least one of
a) a first range of frequencies below one-half of a sampling frequency, $F_S$, and
b) a second range of frequencies above one-half of the sampling frequency, $F_S$.

24. The apparatus of claim 12 wherein the Nyquist zone occupied by the input signal includes one or more of
a) a first range of frequencies below one-half of a sampling frequency, $F_S$, and
b) a second range of frequencies above one-half of the sampling frequency, $F_S$.

* * * * *